(12) United States Patent
Lien (10) Patent No.: US 7,145,779 B2
(45) Date of Patent: Dec. 5, 2006

(54) MEMORY MODULE

(75) Inventor: Shih-Hsiung Lien, Taipei (TW)

(73) Assignee: Optimum Care International Tech.Inc. (TW)

( * ) Notice: Subject to any disclaimer, the term of this patent is extended or adjusted under 35 U.S.C. 154(b) by 221 days.

(21) Appl. No.: 11/009,250

(22) Filed: Dec. 10, 2004

(65) Prior Publication Data

US 2005/0157584 A1  Jul. 21, 2005

(30) Foreign Application Priority Data

Dec. 10, 2003 (TW) ............................ 92221729 U (51) Int. Cl.
*H05K 7/10* (2006.01)
*H05K 7/02* (2006.01)

(52) U.S. Cl. .................. 361/729; 361/728; 361/731; 361/736; 361/730; 439/637; 257/723

(58) Field of Classification Search ........ 361/728–731, 361/736, 760, 785; 257/723; 439/637
See application file for complete search history.

(56) References Cited

U.S. PATENT DOCUMENTS

| | | | | |
|---|---|---|---|---|
| 5,389,000 A * | 2/1995 | DiViesti et al. ............. | 439/157 |
| 5,648,891 A * | 7/1997 | Gierut ........................ | 361/788 |
| 5,708,297 A * | 1/1998 | Clayton ...................... | 257/723 |
| 5,712,766 A * | 1/1998 | Feldman ..................... | 361/737 |
| 5,892,660 A * | 4/1999 | Farnworth et al. .......... | 361/728 |
| 5,953,216 A * | 9/1999 | Farnworth et al. .......... | 361/777 |
| 6,272,021 B1 * | 8/2001 | Nagamine et al. .......... | 361/796 |
| 6,440,775 B1 * | 8/2002 | Khoury ...................... | 438/107 |
| 6,713,854 B1 * | 3/2004 | Kledzik et al. ............. | 257/686 |
| 6,772,261 B1 * | 8/2004 | D'Antonio et al. ......... | 710/301 |
| 2002/0039283 A1 * | 4/2002 | Nakamura et al. .......... | 361/736 |
| 2005/0127368 A1 * | 6/2005 | Lien ........................... | 257/72 |
| 2005/0146856 A1 * | 7/2005 | Lien ........................... | 361/728 |

* cited by examiner

*Primary Examiner*—Kamand Cuneo
*Assistant Examiner*—Dameon E. Levi (57) ABSTRACT

A memory module includes a plurality of memory units and an assembling holder. Each of the memory units includes a memory substrate, at least a memory chipset having a predetermined memory capacity mounted on the memory substrate, and an electric terminal provided at a lower edge portion of the memory substrate. The assembling holder includes an elongated unit housing having an elongated receiving slot extended therealong and a signal terminal provided along the unit housing, wherein the electric terminals of the memory substrates are detachably inserted into the receiving slot of the unit housing to electrically connect the electric terminals with the signal terminal, such that the memory units are alignedly and detachably mounted along the receiving slot in an edge to edge manner.

20 Claims, 11 Drawing Sheets

MEMORY MODULE

BACKGROUND OF THE PRESENT INVENTION

1. Field of Invention

The present invention relates to memory module, and more particularly to a memory module comprising a plurality of individual memory units electrically connected with an elongated unit housing for conducting with a memory slot of a motherboard. Thus, individual memory units are detachably combined to form a memory module so as to maximize maintenance flexibility and minimize operation inconvenience.

2. Description of Related Arts

Memory modules are a kind of standardized component widely used in electrical products such as desktop computers, laptop computers, industrial computers, and printers. Along with the advance of information technology, the world witnesses that the memory capacity of the memory device has been volumetrically expanded and meanwhile, the retrieving speed from the memory device has been significantly reduced. However, the principal structure of the memory device has never been improved to comply with this dramatic change. Commonly, a conventional memory module comprises a unified substrate and a plurality of memory chips spacedly provided on the unified substrate. In case where the unified substrate is damaged, all memory chips, which are welded on the unified substrate, have to be detached from unified substrate first, and then be welded on a new substrate. On the other hand, if the memory chip is damaged, the above mentioned repairing procedure is followed too. Accordingly, the damaged memory chip must be detached from the unified substrate in order to replace a brand new memory chip thereon. As a result, this kind of time consuming and laborious reparation procedure virtually burdened the costs of memory module.

In addition, providing an efficient after-sales service is an advantageous business method in a highly competitive marketing environment today. It is unquestionable that a prolonged repairing period of memory module will be harmful to the service reputation of the manufactures among customers. Moreover, the suppliers of the memory module have to maintain a quantity of memory module stock for potential reparations and exchanges from customers, therefore causing an unnecessary increase of the cost and some undesirable dead stock.

SUMMARY OF THE PRESENT INVENTION

A main object of the present invention is to provide a memory module comprising a plurality of individual memory units electrically connected with an elongated unit housing for conducting with a memory slot of a motherboard. In other words, individual memory units are detachably combined to form a memory module so as to maximize maintenance flexibility and minimize operation inconvenience.

Another object of the present invention is to provide a memory module wherein each individual memory unit can be easily replaced if defective so as to minimize the cost and the time required for the relevant maintenance procedure.

Another object of the present invention is to provide a memory module which would minimize the stock required for maintenance so as to minimize the cost of maintenance or warranty and therefore ultimately the selling price of the present invention.

Another object of the present invention is to provide a memory module which is compatible with typical motherboards so as to universalize for widespread application of the present invention.

Accordingly, in order to accomplish the above objects, the present invention provides a memory module, comprising:

a plurality of memory units, each of which comprises a memory substrate, at least a memory chipset having a predetermined memory capacity mounted on the memory substrate, and an electric terminal provided at a lower edge portion of the memory substrate; and an assembling holder comprising an elongated unit housing having an elongated receiving slot extended therealong and a signal terminal provided along the unit housing, wherein the electric terminals of the memory substrates are detachably inserted into the receiving slot of the unit housing to electrically connect the electric terminals with the signal terminal, such that the memory units are alignedly and detachably mounted along the receiving slot in an edge to edge manner.

These and other objectives, features, and advantages of the present invention would become apparent from the following detailed description, the accompanying drawings, and the appended claims.

DETAILED DESCRIPTION OF THE PREFERRED EMBODIMENT

Referring to FIG. 1 to FIG. 4 of the drawings, a memory module for inserting into a memory holder 30 of a motherboard is illustrated, in which the memory module comprises a plurality of memory units, and an assembling holder 20.

Each of the memory units comprises a memory substrate 10, which is preferably embodied as a circuit board, at least a memory chipset 11 having a predetermined memory capacity electrically mounted on the memory substrate 10 through a chipset terminal 12, and an electric terminal 13 provided at a lower edge portion of the memory substrate 10.

The assembling holder 20 comprises an elongated unit housing 201 having at least an elongated receiving slot 21 extended therealong, and a signal terminal 22 provided along the unit housing 201, wherein the electric terminals 13 of the memory substrates 10 are detachably inserted into the receiving slot 21 of the unit housing 201 to electrically connect the electric terminals 13 with the signal terminal 22, such that the memory units are alignedly and detachably mounted along the receiving slot 21 in an edge to edge manner. According to the preferred embodiment, the elongated unit housing 201 has a plurality of receiving slots 21 spacedly formed therealong wherein the plurality of memory units are inserted into the receiving slots 21 respectively.

The assembling holder 20 further comprises two side retaining arms 202 upwardly and integrally extended from two ends of the elongated unit housing 202 to form a U-shape structure for substantially retaining the memory units which are inserted into the respective receiving slots 21. Each of the side retaining arms 202 has an inner engaging slot 23 formed therealong wherein an outer edge portion of the memory substrate 10 of two outermost memory units are engaged with the respective inner engaging slot 23 so as to fittedly yet detachably mount within the assembling holder 20.

In other words, when the memory units are alignedly mounted along the receiving slot 21, the memory units would be held between the two side retaining arms 202 so as to substantially retain them in position along the respective receiving slots 21.

In order to further enhance the engagement between the side retaining arms 202 and the respective memory units, and to protect the memory substrate 10 from potential damage, each of the outermost memory substrates 10 further has an engaging tracks 15 formed on an outer side edge portion thereof, wherein the engaging tracks 15 are slidably engaged with the corresponding engaging slots 23 so as to securely retain and support the memory units within the assembling holder 20. Moreover, each of the memory substrates 10 is shaped and sized in such a manner that when they are inserted into the respective receiving slot 21, each of the memory substrates 10 is fittedly and tightly biasing against the adjacent memory substrate 10 to form a secure structure.

For the purpose of the preferred embodiment of the present invention, the memory holder 30 is one which is typically provided in a conventional motherboard for a computer system. The memory holder 30 usually has an elongated memory slot 32 for receiving the memory module, and comprises a plurality of data terminals 33 provided in the memory slot 32 for electrically connecting the memory module with the motherboard, and two holding arms 31 operatively extended from two ends of the memory slot 32 to engage with the memory module for securely retaining it in position in the memory slot 32.

Figure 1:
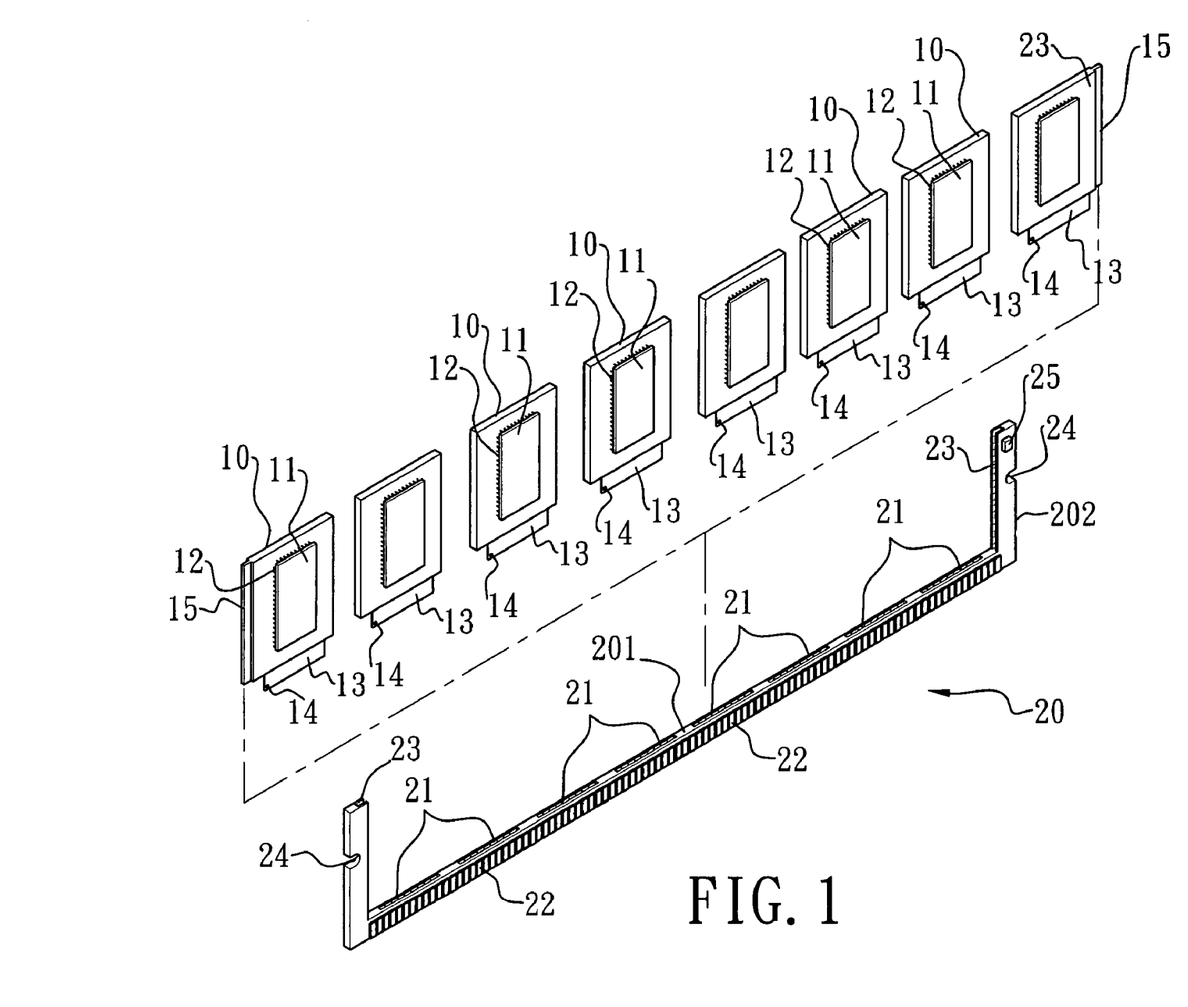
FIG. 1 is an exploded perspective view of a memory module according to a preferred, embodiment of the present invention.
Figure 2:
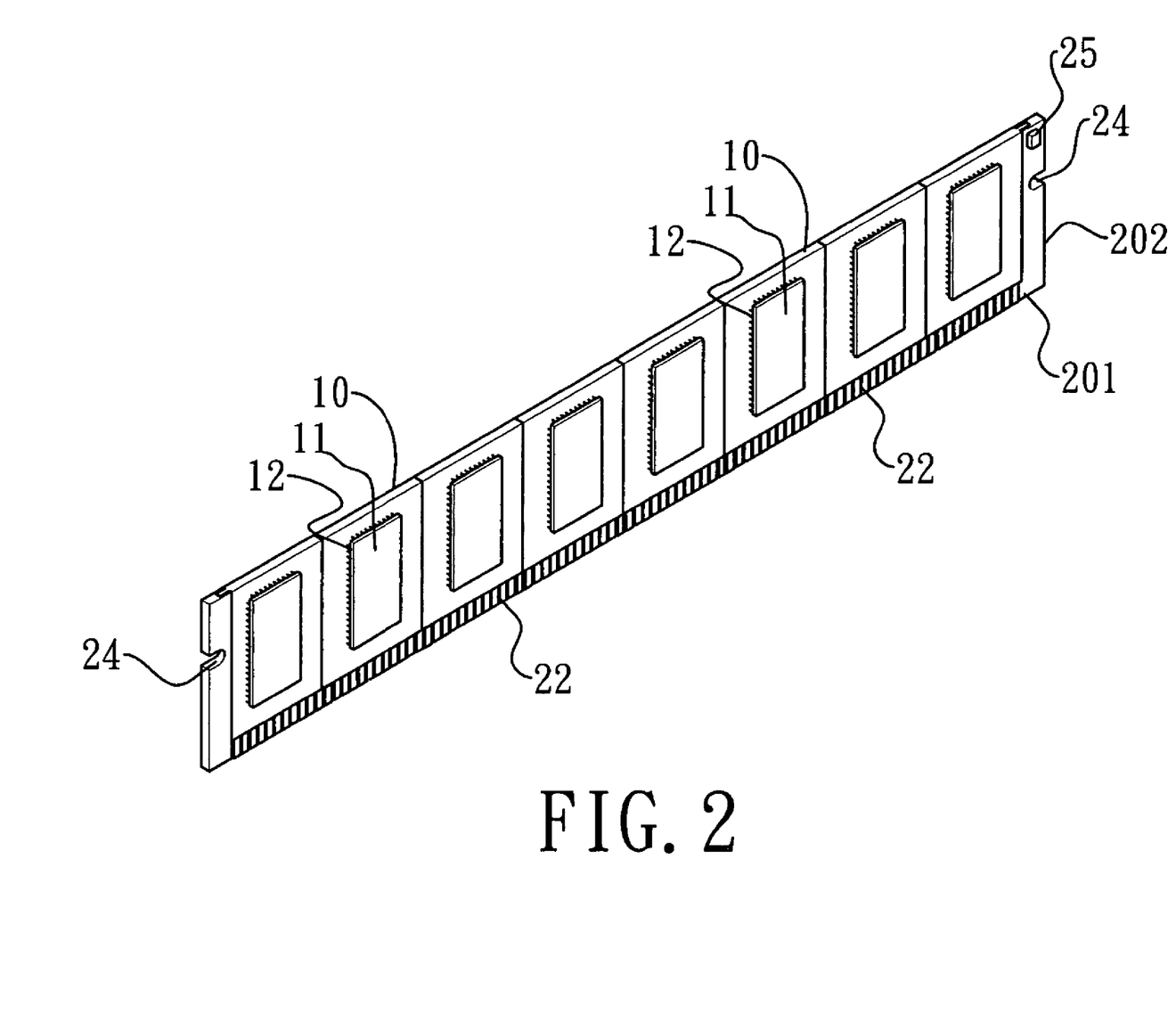
FIG. 2 is a perspective view of the memory module according to the above preferred embodiment of the present invention.
Figure 3:
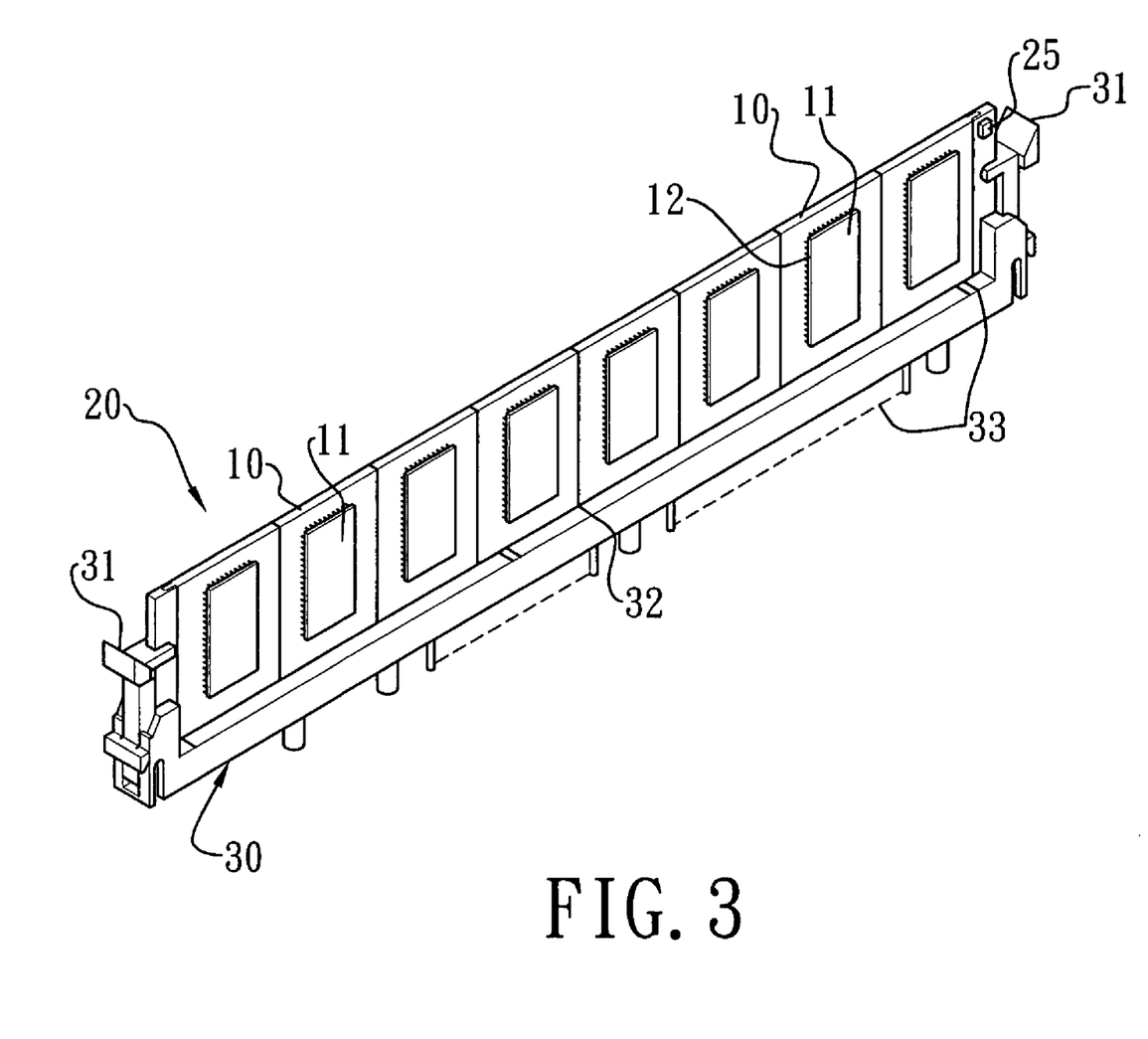
FIG. 3 is a schematic diagram of the memory module according to the above preferred embodiment of the present invention.

Referring to FIG. 1, FIG. 2 and FIG. 3 of the drawings, each of the retaining arms 202 further has a mounting slot 24 indently formed on an outer side thereof and adapted for engaging with the respective holding arm 31 of the memory holder 30.

Figure 4:
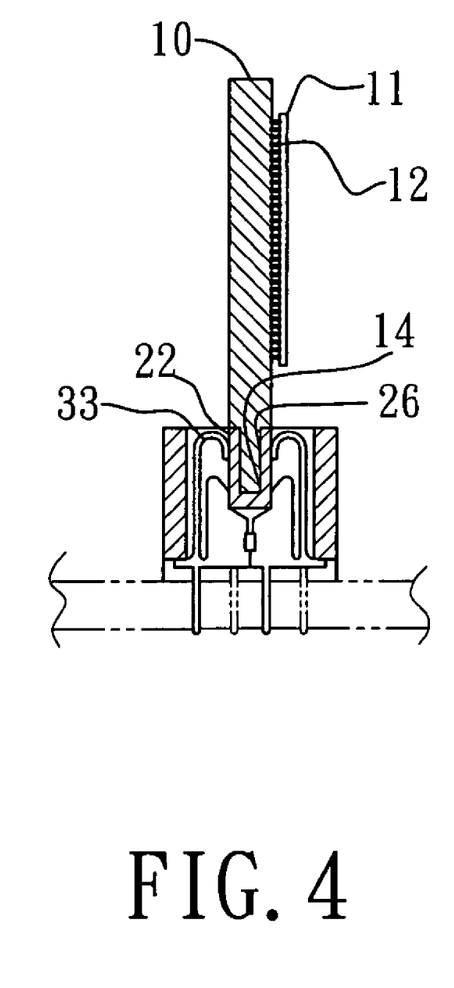
FIG. 4 is a side view of the memory module according to the above preferred embodiment of the present invention.

Referring to FIG. 4 of the drawings, the assembling holder 20 further has a conductive element 26 provided along an inner wall of the receiving slot 21 of the elongated unit housing 201 wherein a contacting portion 14 of each of the electric terminals 13 of each of the memory substrates 10 is electrically contacted with the conductive element 26, which is also electrically contacted with the signal terminal 22, when it is inserted into the receiving slot 21. In other words, each of the memory units is electrically connected with each other through the conductive element 26 in the elongated unit housing 201 through the respective electric terminal 13.

Furthermore, it is worth illustrating, as in FIG. 4, that when the memory module is inserted into the memory holder 30 on the motherboard, the signal terminal 22 of the assembling holder 20 is arranged to electrically connect with the data terminal 33 of the memory holder 30 such that electronic data from the memory substrate 10 and the memory chipset 11 can be transferred to the motherboard through the signal terminal 22 and the data terminal 33.

Referring to FIG. 2 to FIG. 3 of the drawings, the assembling holder 20 further comprises an Electrically Erasable Programmable ROM (EEPROM) 25 electrically connected with one of the memory substrate 10 so as to comprehensively handle data from the individual memory substrates 10 and the respective memory chipsets 11. It is of course worth mentioning that all information transferred between the memory units and the motherboard must be accomplished through the electric terminal 13, the conductive element 26, and the signal terminal 22.

From the foregoing description, it could be seen that the above-mentioned objects have been substantially accomplished. When one or more memory units are found defective, a service provider may simply need to detach the defective memory unit from the assembling holder 20 and replace a new one. In other words, unless all the memory units 1 are defective and need replacement, the procedures, complexity, time, and the cost for maintenance of the present invention can be substantially minimized.

Figure 5:
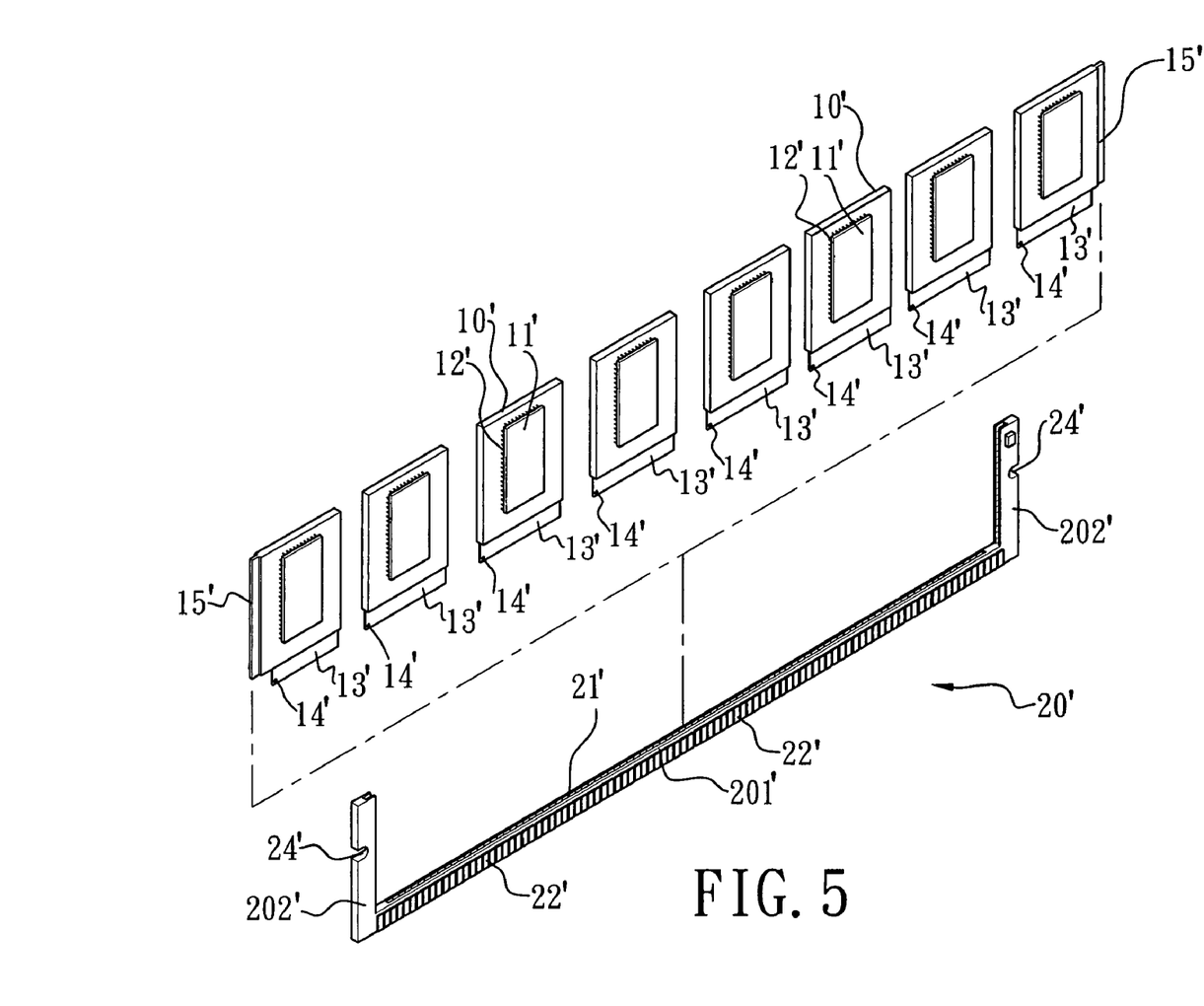
FIG. 5 is a first alternative mode of the memory module according to the above preferred embodiment of the present invention.

Referring to FIG. 5 of the drawings, a first alternative mode of the memory module of the present invention is illustrated. The first alternative mode is similar to the above-mentioned preferred embodiment except that there is only one single elongated receiving slot 21' on the assembling holder 20' wherein the signal terminal 22' is also provided on the elongated unit housing 201'. Furthermore, the electric terminals 13' are downwardly extended from the respective memory substrate 10' to reach the elongated receiving slot 21' in such a manner that the contacting portion 14' of the respective electric terminal 13' is electrically connected with the conductive element 26.

As in the preferred embodiment, the mounting slots 24' are formed on the side retaining arm 202' so as to engage with the memory holder 30 of the motherboard. The memory chipset 11' is electrically mounted on the respective memory substrate 10' through the respective chipset terminal 12'. As such, each of the memory units is detachably assembled to the assembling holder 20' so as to form the memory module for a computer system. The engaging tracks 15' also help in retaining the memory substrates 10' in position within the assembling holder 20'.

Figure 6:
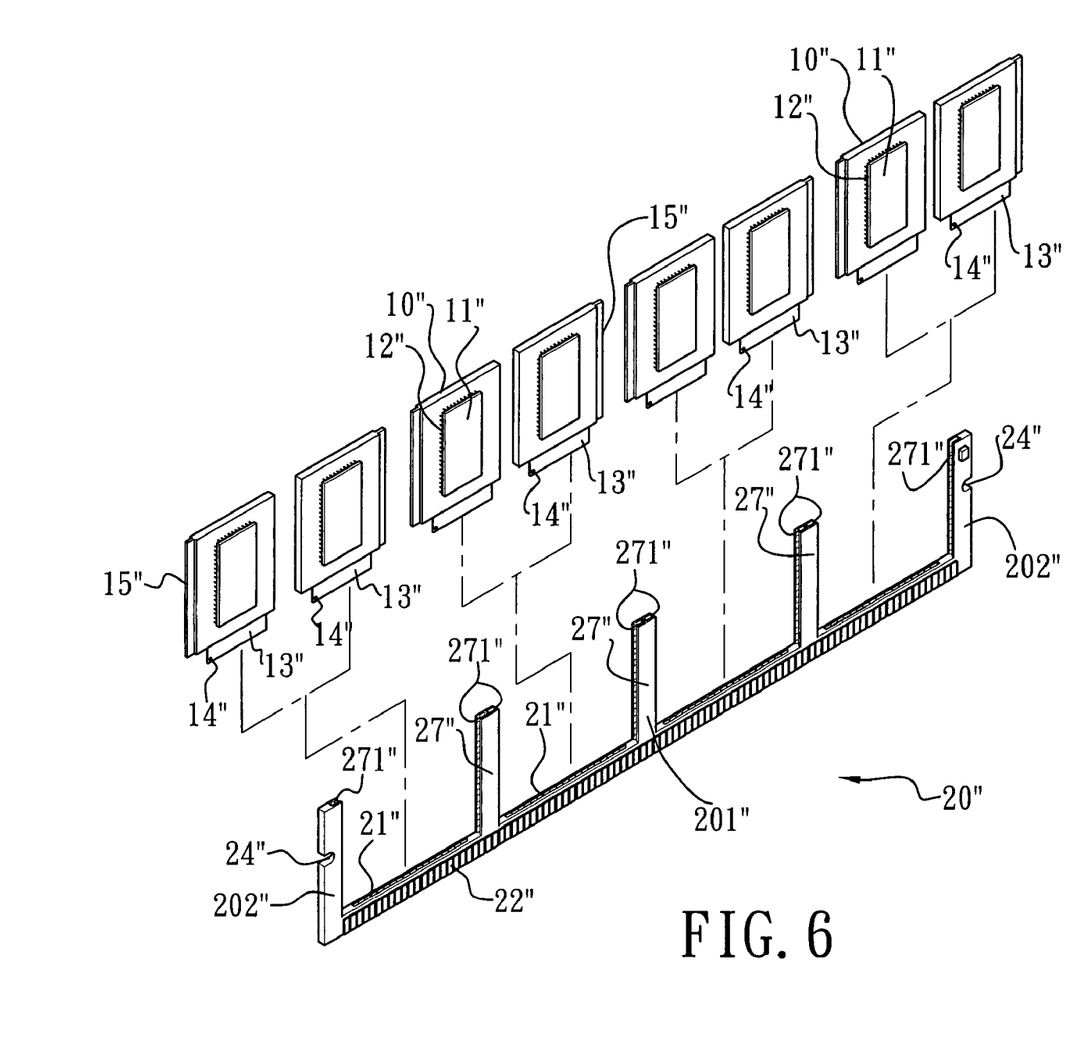
FIG. 6 is an exploded perspective view of a second alternative mode of the memory module according to the above preferred embodiment of the present invention.
Figure 7:
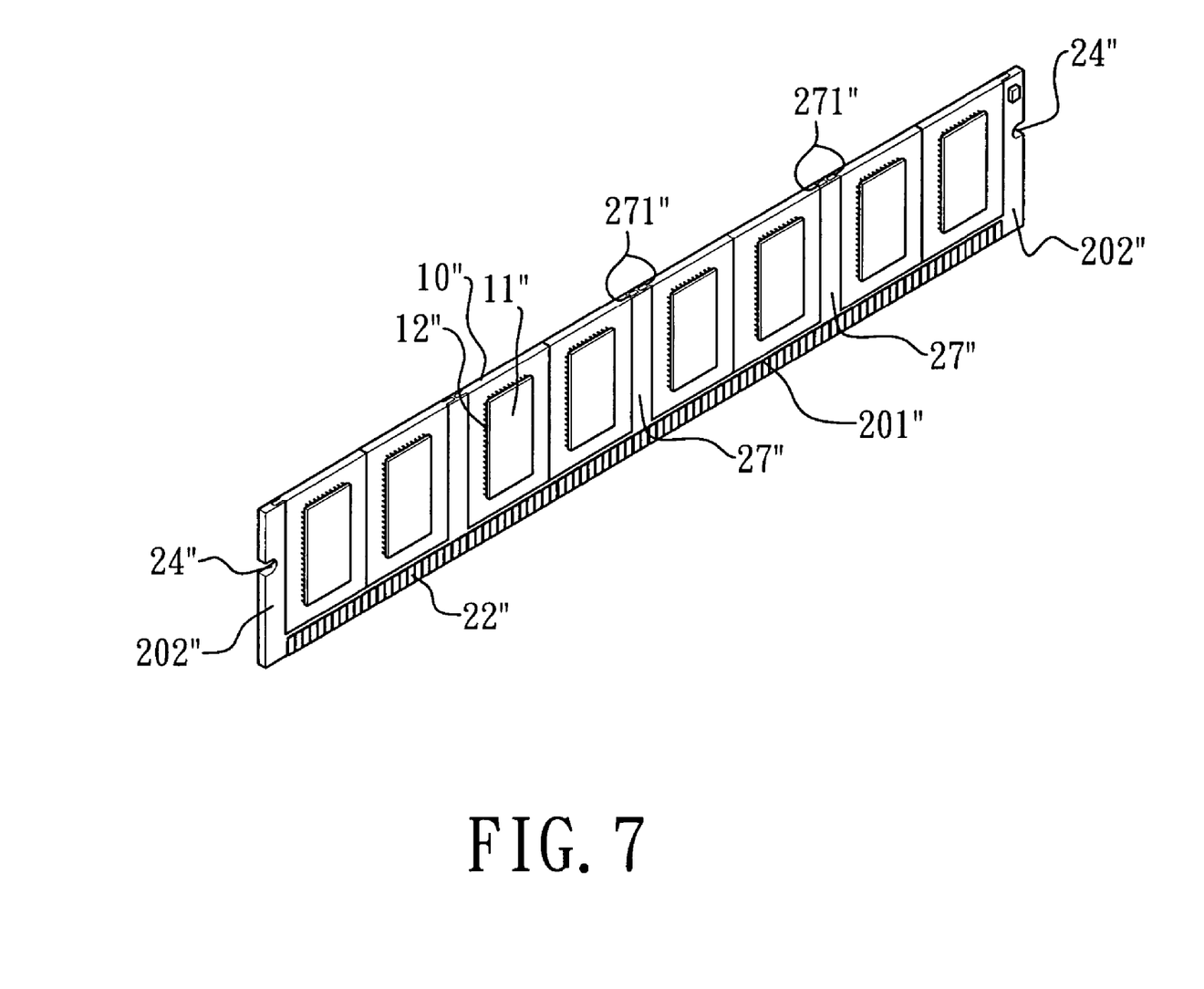
FIG. 7 is a perspective view of a second alternative mode of the memory module according to the above preferred embodiment of the present invention.

Referring to FIG. 6 to FIG. 7 of the drawings, a second alternative mode of the memory module according to the preferred embodiment of the present invention is illustrated. The second alternative mode is similar to the above-mentioned preferred embodiment as shown in FIG. 1 to FIG. 4, except that the assembling holder 20" further comprises a plurality of reinforcing arms 27" each of which is upwardly extended from the elongated unit housing 201" between the two retaining arms 202" to evenly divide the receiving slot 21" into a plurality of slot portions therebetween, wherein each of the slot portions allows at least one of the memory units to be alignedly mounted therealong so as to guide the memory units to align with the receiving slot 21". Each of the reinforcing arms 27" has two elongated reinforcing slots 271" formed along two sides thereof for engaging with the respective memory substrate 10". In other words, opposed outer side edge portions of the memory substrates 10" in a particular slot portion are slidably engaged with the respective reinforcing slots 271" so as to prevent unwanted movements of those memory units in that respective slot portion. Moreover, the two side retaining arms 202" can be formed as two reinforcing arms 27" having only one reinforcing slot 271" wherein the respective inner engaging slot 23" forms as the reinforcing slot 271".

Accordingly, the each of the memory substrates 10" further has an engaging track 15" formed on a side edge portion of each of the memory substrate 10" for engaging with the corresponding reinforcing slots 271" of the reinforcing arms 27". According to the second alternative mode, each of the partitions is arranged to receive two of the memory substrates 10" each of which is engaged with the respective reinforcing slot 271". Thus, a length of each of the partition equals a sum of the length of two adjacent memory substrates 10" such that they are capable of being fittedly supported within the respective partition. Obviously, each of the memory units 1" are received in the receiving slot 21" formed on the elongated unit housing 201" to form the memory module, as shown in FIG. 7 of the drawings.

As in the preferred embodiment, the mounting slots 24" are formed on the reinforcing arms 27" (side retaining arm 202") so as to engage with the memory holder 30 of the motherboard. The memory chipset 11" is electrically mounted on the respective memory substrate 10" through the respective chipset terminal 12". As such, each of the memory units is detachably assembled to the assembling holder 20" so as to form the memory module for a computer system.

Referring to FIG. 8 to FIG. 11 of the drawings, a third alternative mode of the present invention according to the above preferred embodiment is illustrated. The third alternative mode is similar to the preferred embodiment except that the assembling holder 20A further comprises an elongated retention member 4A pivotally supported on top of the memory substrates 10A between the two side retaining arms 202A for substantially restricting a lateral movement of the memory units within the assembling holder 20A so as fortify an overall strength of said memory module of the present invention.

Specifically, the retention member 4A has one pivot end pivotally mounted to a top end of one of the side retaining arms 202A through a pivot hole 41A, a connecting hole 28A, and a pivot member 42A wherein another opposed detachable end of the retention member 4A is pivotally moved on top of the memory substrates 10A and the memory chipsets 11A to detachably mount with a top end of the opposed side retaining arms 202A.

Moreover, the retention member 4A further has a securing slot 40A longitudinally and indently extended therealone between the pivot end and the detachable end in such a manner that when the retention member 4A is pivotally mounted between the two side retaining arms 202A, a top edge portion of each of the memory substrate 10A is arranged to receive in the securing slot 40A such that the memory substrates 10A can be substantially retained in position within the assembling holder 20A.

Figure 8:
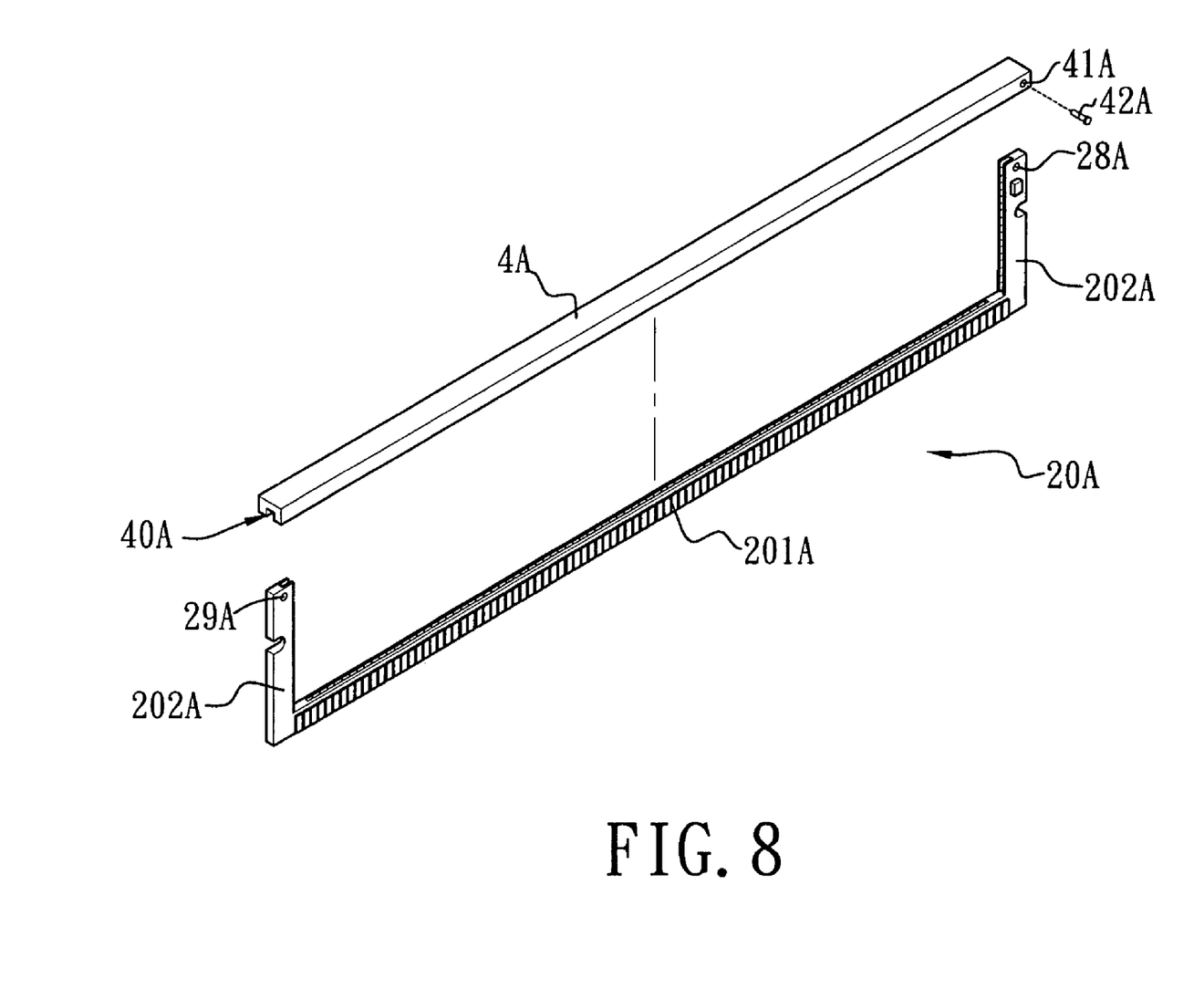
FIG. 8 is a schematic diagram of the assembling holder according to the above third alternative mode of the present invention.
Figure 9:
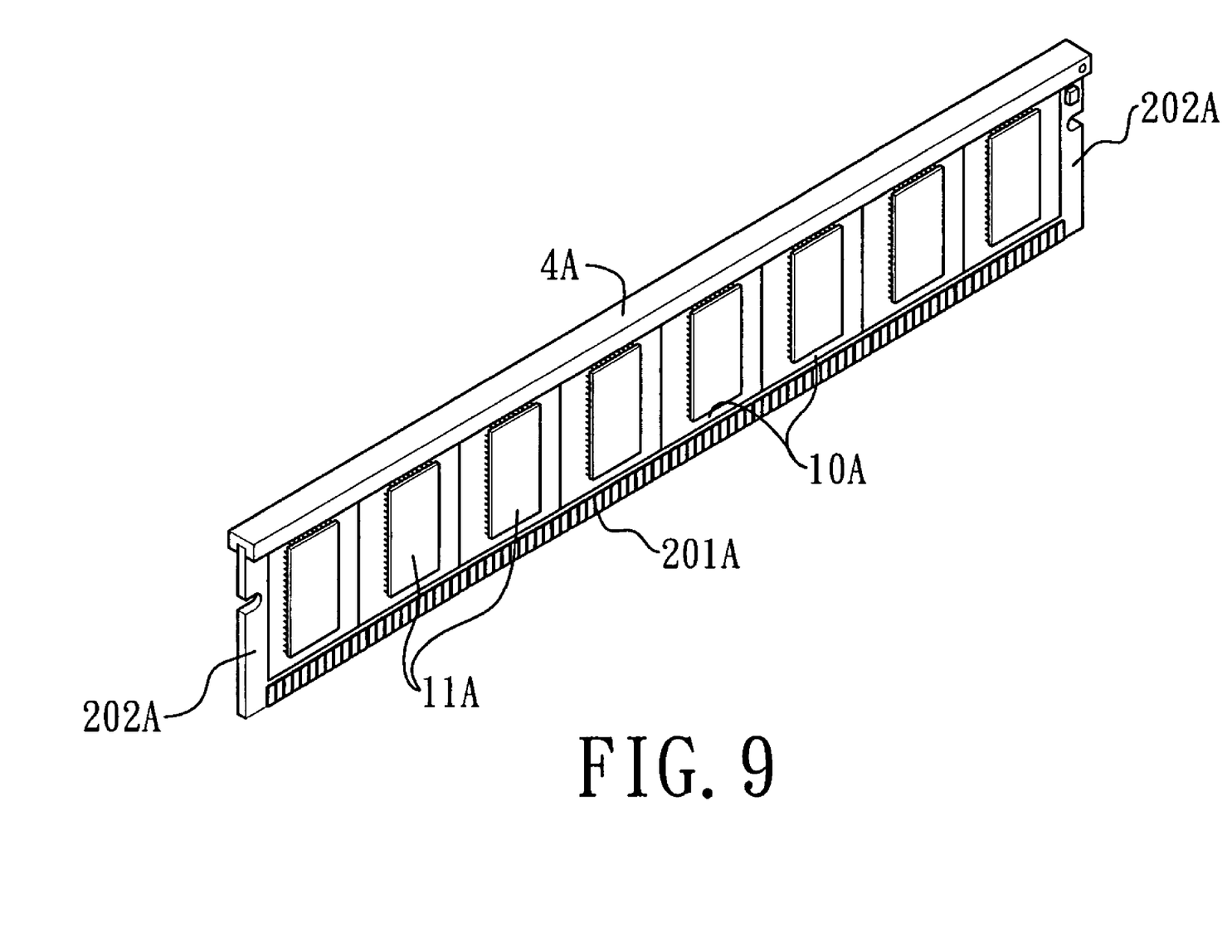
FIG. 9 is the third alternative mode of the memory module according to the above preferred embodiment of the present invention.
Figure 10:
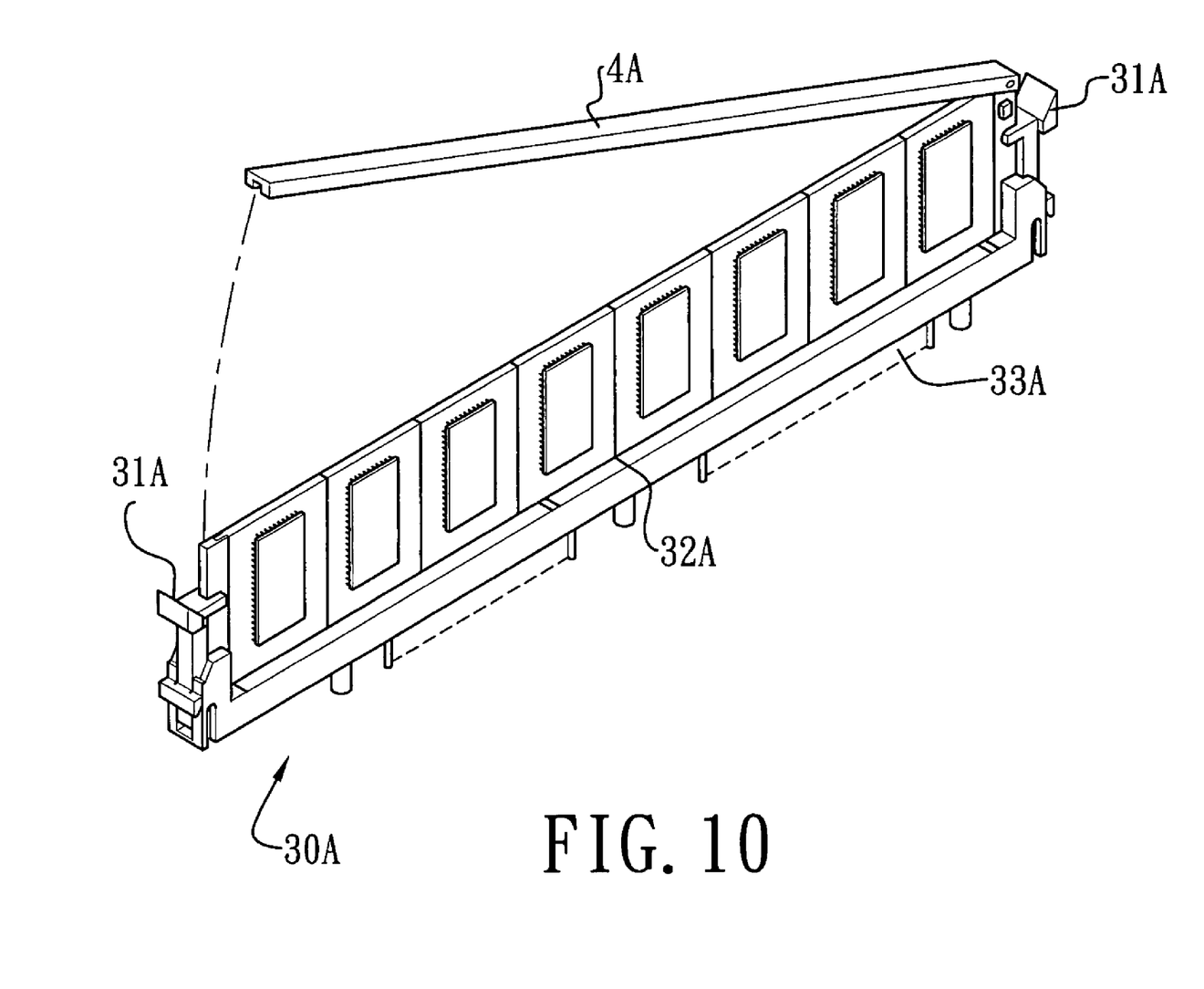
FIG. 10 is a schematic diagram of the memory module according to the above third alternative mode of the present invention.
Figure 11:
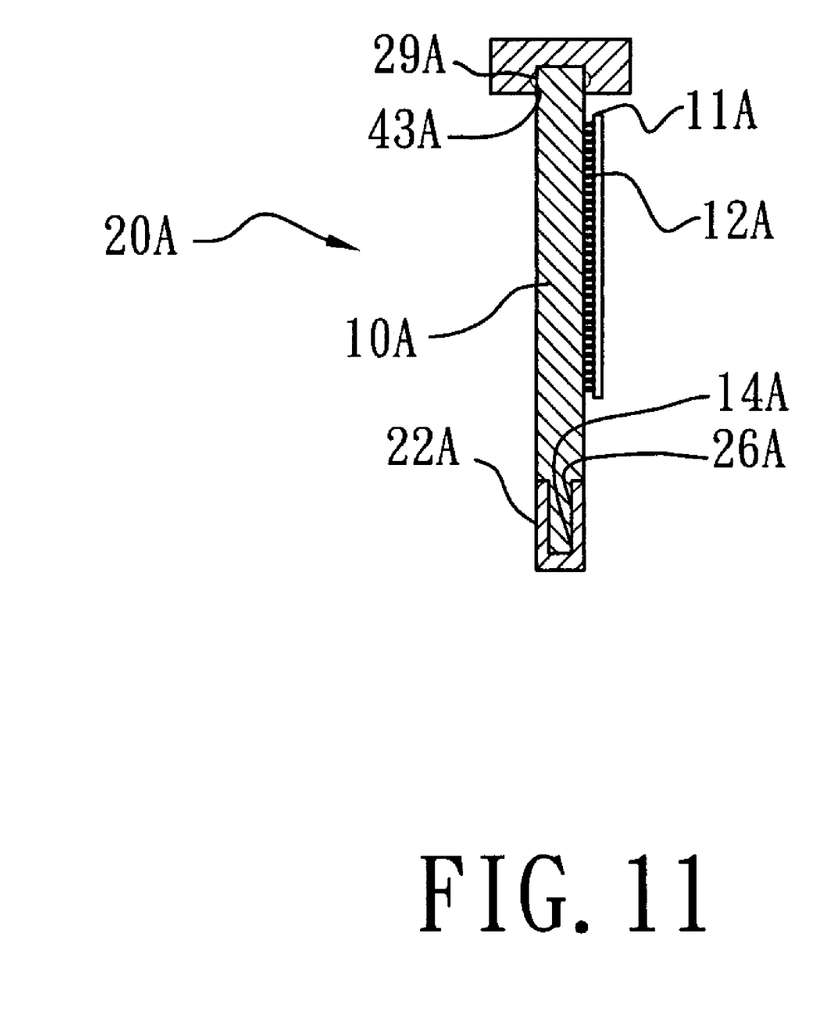
FIG. 11 is a side view of the memory module according to the above third alternative mode of the present invention.

Referring to FIG. 8 and FIG. 11 of the drawings, the assembling holder 20A further comprises means for detachably mounting the retention member 4A to the side retaining arm 202A. The mounting means contains a latching slot 43A indently formed on a sidewall of the securing slot 40A, and comprises a mounting latch 29A slightly protruded from a top portion of the respective side retaining arm 202A in such a manner that when the retention member 4A is pivotally moved to communicate with the side retaining arm 202A, the latching slot 43A is engaged with the mounting latch 29A so as to detachably mount the retention member 4A firmly on the assembling holder 20A.

From the forgoing description, it can be shown that the assembling holder 20A, which assembles all the memory units 10A, can be mounted onto the memory holder 30A wherein the elongated unit housing 201A is inserted into the memory slot 32A so that the signal terminal 22A is arranged to contact with the data terminal 33A. On the other hands, the holding arms 31A of the memory holder 30A are adapted to detachably mount with the respective side retaining arm 202A.

Obviously, as in the preferred embodiment of the present invention, the memory chipset 11A is electrically mounted on the memory substrate 10A via the chipset terminal 12A. Moreover, the electric terminal 13A of the memory substrate 10A is inserted into the elongated unit 22A wherein the conductive element 26A is to electrically connect the contracting portions 14A of the electric terminal 13A.

One skilled in the art will understand that the embodiment of the present invention as shown in the drawings and describe-ed above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A memory module for mounting in a memory slot of a motherboard, comprising:

a plurality of memory units, each of which comprises a memory substrate, at least a memory chipset having a predetermined memory capacity mounted on said memory substrate, and an electric terminal provided at a lower edge portion of said memory substrate; and an assembling holder comprising an elongated unit housing having an elongated receiving slot extended therealong and a signal terminal provided along said unit housing, wherein said electric terminals of said memory substrates are detachably inserted into said receiving slot of said unit housing to electrically connect said electric terminals with said signal terminal, such that said memory units are alignedly and detachably mounted along said receiving slot in an edge to edge manner.

2. The memory module, as recited in claim 1, wherein said assembling holder further has a conductive element provided along an inner wall of said receiving slot of said elongated unit housing to electrically connect with said signal terminal, wherein said electric terminal of each of said memory substrate is electrically contacted with said conductive element when said electric terminal of said memory substrate is inserted into said receiving slot so that said memory units are electrically connected with said signal terminal through said conductive element.

3. The memory module, as recited in claim 1, wherein said assembly holder further comprises two side retaining arms upwardly and integrally extended from two ends of said elongated unit housing to form a U-shape structure, such that when said memory units are alignedly mounted along said receiving slot, said memory units are held between said side retaining arms so as to substantially retain said memory units in position along said receiving slot.

4. The memory module, as recited in claim 2, wherein said assembly holder further comprises two side retaining arms upwardly and integrally extended from two ends of said elongated unit housing to form a U-shape structure, such that when said memory units are alignedly mounted along said receiving slot, said memory units are held between said side retaining arms so as to substantially retain said memory units in position along said receiving slot.

5. The memory module, as recited in claim 3, wherein each of said side retaining arms has an inner engaging slot formed therealong and each of said two outermost memory substrates further has an engaging track extended sidewardly to slidably engage with said respective engaging slot when said two outermost memory units are alignedly mounted along said receiving slot so as to substantially retain said memory units in position within said assembling holder.

6. The memory module, as recited in claim 4, wherein each of said side retaining arms has an inner engaging slot formed therealong and each of said two outermost memory substrates further has an engaging track sidewardly extended therefrom to slidably engage with said respective engaging slot when said two outermost memory units are alignedly mounted along said receiving slot so as to substantially retain said memory units in position within said assembling holder.

7. The memory module, as recited in claim 4, wherein each of said retaining arms further has a mounting slot indently formed on an outer side thereof, thereby, when said memory module is inserted into said memory slot of said motherboard, a locking arm of said computer motherboard is adapted to engage with said respective mounting slot of said respective retaining arm so as to securely lock up said memory module along said memory slot.

8. The memory module, as recited in claim 6, wherein each of said retaining arms further has a mounting slot indently formed on an outer side thereof, thereby, when said memory module is inserted into said memory slot of said motherboard, a locking arm of said computer motherboard is adapted to engage with said respective mounting slot of said respective retaining arm so as to securely lock up said memory module along said memory slot.

9. The memory module, as recited in claim 3, wherein said assembling holder further comprises a plurality of reinforcing arms spacedly and upwardly extended from said elongated unit housing between said two retaining arms to evenly divide said receiving slot into a plurality of slot portions therebetween, wherein each of said slot portions allows at least one of said memory units to be alignedly mounted therealong so as to guide said memory units to align with said receiving slot.

10. The memory module, as recited in claim 6, wherein said assembling holder further comprises a plurality of reinforcing arms spacedly and upwardly extended from said elongated unit housing between said two retaining arms to evenly divide said receiving slot into a plurality of slot portions therebetween, wherein each of said slot portions allows at least one of said memory units to be alignedly mounted therealong so as to guide said memory units to align with said receiving slot.

11. The memory module, as recited in claim 8, wherein said assembling holder further comprises a plurality of reinforcing arms spacedly and upwardly extended from said elongated unit housing between said two retaining arms to evenly divide said receiving slot into a plurality of slot portions therebetween, wherein each of said slot portions allows at least one of said memory units to be alignedly mounted therealong so as to guide said memory units to align with said receiving slot.

12. The memory module, as recited in claim 9, wherein each of said reinforcing arms has two elongated reinforcing slots formed along two side edges thereof, wherein a side edge of said memory substrate is slidably engaged with said respective reinforcing slot of said reinforcing arm so as to substantially retain said memory substrate at said respective slot portion.

13. The memory module, as recited in claim 10, wherein each of said reinforcing arms has two elongated reinforcing slots formed along two side edges thereof, wherein a side edge of said memory substrate is slidably engaged with said respective reinforcing slot of said reinforcing arm so as to substantially retain said memory substrate at said respective slot portion.

14. The memory module, as recited in claim 11, wherein each of said reinforcing arms has two elongated reinforcing slots formed along two side edges thereof, wherein a side edge of said memory substrate is slidably engaged with said respective reinforcing slot of said reinforcing arm so as to substantially retain said memory substrate at said respective slot portion.

15. The memory module, as recited in claim 3, wherein said assembling holder further comprises a retention member having a pivot end pivotally mounted to a top end of one of said side retaining arms and an opposed detachable end detachably mounted on a top end of another said side retaining arm to reinforce said memory units between said retention member and said elongated unit housing so as to ensure said memory units alignedly mounted along said receiving slot.

16. The memory module, as recited in claim 5, wherein said assembling holder further comprises a retention member having a pivot end pivotally mounted to a top end of one of said side retaining arms and an opposed detachable end detachably mounted on a top end of another said side retaining arm to reinforce said memory units between said retention member and said elongated unit housing so as to ensure said memory units alignedly mounted along said receiving slot.

17. The memory module, as recited in claim 14, wherein said assembling holder further comprises a retention member having a pivot end pivotally mounted to a top end of one of said side retaining arms and an opposed detachable end detachably mounted on a top end of another said side retaining arm to reinforce said memory units between said retention member and said elongated unit housing so as to ensure said memory units alignedly mounted along said receiving slot.

18. The memory module, as recited in claim 15, wherein said retention arm further has a securing slot longitudinally extended between said pivot end and said detachable end, wherein a top edge portion of each of said memory substrates is received in said securing slot when said retention arm is mounted on top of said memory substrates between said two side retaining arms, so as to restrict a lateral movement of each of said memory units along said receiving slot.

19. The memory module, as recited in claim 16, wherein said retention arm further has a securing slot longitudinally extended between said pivot end and said detachable end, wherein a top edge portion of each of said memory substrates is received in said securing slot when said retention arm is mounted on top of said memory substrates between said two side retaining arms, so as to restrict a lateral movement of each of said memory units along said receiving slot.

20. The memory module, as recited in claim 17, wherein said retention arm further has a securing slot longitudinally extended between said pivot end and said detachable end, wherein a top edge portion of each of said memory substrates is received in said securing slot when said retention arm is mounted on top of said memory substrates between said two side retaining arms, so as to restrict a lateral movement of each of said memory units along said receiving slot.

* * * * *